United States Patent
Cros et al.

(10) Patent No.: US 8,963,345 B2
(45) Date of Patent: Feb. 24, 2015

(54) ENCAPSULATION DEVICE HAVING IMPROVED SEALING

(75) Inventors: Stephane Cros, Chambery (FR); Nicole Alberola, Les Deserts (FR); Jean-Paul Garandet, Le Bourget du Lac (FR); Arnaud Morlier, Faucigny (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 255 days.

(21) Appl. No.: 13/515,447

(22) PCT Filed: Dec. 9, 2010

(86) PCT No.: PCT/EP2010/069235
§ 371 (c)(1),
(2), (4) Date: Sep. 7, 2012

(87) PCT Pub. No.: WO2011/073073
PCT Pub. Date: Jun. 23, 2011

(65) Prior Publication Data
US 2013/0001808 A1   Jan. 3, 2013

(30) Foreign Application Priority Data
Dec. 14, 2009   (FR) ...................... 09 58948

(51) Int. Cl.
*H01L 23/29* (2006.01)
*H01L 21/00* (2006.01)
(Continued)

(52) U.S. Cl.
CPC .......... *H01L 51/5237* (2013.01); *H01L 51/448* (2013.01); *Y02E 10/549* (2013.01)

USPC .... 257/790; 257/687; 257/788; 257/E23.116; 257/E23.119; 438/106; 438/127

(58) Field of Classification Search
USPC .................. 257/787–790, E23.119, E21.502, 257/678–734, 777–796, 773, E23.116; 438/106, 127
See application file for complete search history.

(56) References Cited

U.S. PATENT DOCUMENTS

| | | |
|---|---|---|
| 5,272,856 A | 12/1993 | Pharo |
| 5,751,062 A * | 5/1998 | Daikoku et al. ............. 257/722 |
| 6,150,187 A | 11/2000 | Zyung et al. |

(Continued)

FOREIGN PATENT DOCUMENTS

| | | |
|---|---|---|
| JP | 54-136985 | 10/1979 |
| JP | 2000-68046 | 3/2000 |

(Continued)

OTHER PUBLICATIONS

International Search Report issued Mar. 25, 2011 in PCT/EP2010/069235.

(Continued)

*Primary Examiner* — Jasmine Clark
(74) *Attorney, Agent, or Firm* — Oblon, Spivak, McClelland, Maier & Neustadt, L.L.P.

(57) ABSTRACT

An encapsulation device including two casings made of a flexible polymer material, each delimiting a sealed space, and at least one hydrophobic material filling each of the casings, the casings being stacked and sealingly interconnected at peripheral edges thereof, a sealed space then being defined between the two casings for receiving a device to be encapsulated.

24 Claims, 2 Drawing Sheets

(51) Int. Cl.
*H01L 51/52* (2006.01)
*H01L 51/44* (2006.01)

(56) References Cited

U.S. PATENT DOCUMENTS

| | | | |
|---|---|---|---|
| 6,207,892 B1 * | 3/2001 | Lucey, Jr. | 174/17 LF |
| 7,867,811 B2 * | 1/2011 | Kim et al. | 438/82 |
| 2008/0223442 A1 | 9/2008 | Beck et al. | |
| 2008/0264473 A1 | 10/2008 | Cumpston et al. | |
| 2009/0151868 A1 | 6/2009 | Kim et al. | |
| 2010/0012177 A1 | 1/2010 | Yang et al. | |
| 2013/0040105 A1 | 2/2013 | Garandet et al. | |

FOREIGN PATENT DOCUMENTS

| | | |
|---|---|---|
| JP | 2000-261022 | 9/2000 |
| JP | 2001-217446 | 8/2001 |
| JP | 2002-217441 | 8/2002 |
| JP | 2005-101033 | 4/2005 |
| JP | 2006-278702 | 10/2006 |
| JP | 2009-527896 | 7/2009 |
| WO | WO 2007/003051 A1 | 1/2007 |
| WO | WO 2007/098021 A2 | 8/2007 |
| WO | WO 2008/112239 A2 | 9/2008 |

OTHER PUBLICATIONS

French Preliminary Search Report issued Aug. 13, 2010 in Patent Application No. 0958948.
Frederik C. Krebs et al., "Encapsulation of Polymer Photovoltaic Prototypes", Solar Energy Materials and Solar Cells 90 (2006) 3633-3643.
P. E. Burrows et al., "Ultra Barrier Flexible Substrates for Flat Panel Displays", Displays 22 (2001) 65-69.
Karl-Heinz Haas et al., "Functionalized Coating Materials Based on Inorganic-Organic Polymers",Thin Solid Films 351 (1999) 198-203.
Office Action issued Sep. 11, 2014 in Chinese Patent Application No. 201080061690.1 (with English translation).
Office Action issued Sep. 16, 2014 in Japanese Patent Application No. 2012-543610 (with English translation).

* cited by examiner

US 8,963,345 B2

ENCAPSULATION DEVICE HAVING IMPROVED SEALING

TECHNICAL FIELD AND PRIOR ART

The present invention relates to an encapsulation device having improved sealing, for example intended for the encapsulation of organic photovoltaic cells and an assembly formed of such an encapsulation device and a device, such as a photovoltaic cell, encapsulated in said device.

Organic solar cells comprise a semi-conductor organic polymer associated with metal electrodes. These cells particularly have the advantage of offering a certain mechanical flexibility and of being low cost compared to crystalline or polycrystalline silicon photovoltaic cells, particularly on account of the method of production thereof.

However, they have the drawback of being sensitive to humidity and oxygen. If they are not correctly protected, their lifetime is shortened. It is thus desirable to protect them from humidity and oxygen.

Several known techniques exist for carrying out such an encapsulation.

One of the techniques described in the document Krebs F. et al, *Solar Energy Materials and Solar Cells* 90(2006) 3633-3643 consists in placing a photovoltaic cell between two covers, and sealing the two covers by a joint. More particularly, in the document cited above, one of the covers is a plate of glass, the other is a plate of aluminium and the joint is made of glass fibre reinforced epoxy material. This encapsulation, in order to be effectively sufficiently sealed to humidity and oxygen, needs to use a thick plate of glass. On the one hand, the assembly thereby formed has a non negligible mass. On the other hand, it no longer offers the flexibility of the encapsulated cell. And, finally, this technique is limited to small surfaces.

There also exists a technique consisting in enclosing an organic light emitting diode between two layers of organic polymer covered with dense layers of metal oxide, the organic polymer on its own being permeable to the gas. Said metal oxide layers are deposited by vacuum deposition. This technique thus requires costly equipment, which runs counter to a reduction in the cost of manufacture of photovoltaic cells. This technique is described in the document Burrows P. et al., *Ultra barrier flexible substrates for flat panel displays, in Displays* 22 (2001) 65-69.

There also exists a technique consisting in placing a photovoltaic cell in a sealed casing and filling the casing with oil, thus immersing the cell in the oil. The oil, in which the cell is immersed, forms for the cell bathed therein a barrier to humidity thanks to its hydrophobic properties and a barrier to oxygen. However, there exists a risk of solubilisation of the organic polymers used to form the cells in the oil, and thereby a risk of degradation of the cell.

It is consequently an aim of the present invention to offer a device for encapsulating one or more devices to be protected, for example photovoltaic cells, efficiently protecting the device(s) from humidity or oxygen, and more generally from gases.

It is also an aim of the present invention to offer an encapsulation device of simple design, of low mass and enabling the flexibility properties thereof to be conserved.

DESCRIPTION OF THE INVENTION

The aforementioned aims are attained by an encapsulation device comprising at least one wall intended to delimit an inner sealed space in which will be placed the device to be protected or the object, the partition being formed of a flexible polymer casing filled with a hydrophobic liquid.

In other words, a flexible container is formed, the wall of which is constituted of a confined oil, said oil being isolated from the contents.

According to the invention, the device to be protected is protected from humidity and the atmosphere by the oil barrier, without being in contact with it. Furthermore, the oil is sufficiently transparent to light rays so as not to perturb the correct operation of the device, in the case where it is a photovoltaic cell.

In addition, the mass of the encapsulation device is reduced, since it only comprises the oil and the casing made of relatively thin flexible polymer.

The main subject matter of the present invention is then an encapsulation device comprising at least one casing made of a flexible polymer material delimiting a sealed space, and at least one hydrophobic material filling said casing.

The at least one casing may comprise a first sheet made of polymer material and a second sheet made of polymer material interconnected at the exterior edges thereof so as to define a sealed volume to the hydrophobic material between the two sheets.

The device may comprise two casings made of a flexible polymer material each delimiting a sealed space to the hydrophobic material, and at least one hydrophobic material filling each of said casings, said casings being stacked and sealingly interconnected at the peripheral edges thereof, a sealed space then being defined between the two casings.

The contact angle of a drop of liquid of the hydrophobic material on the inner surface of the at least one casing may be less than 60°, advantageously less than 30°, and in an even more advantageous manner less than 10°.

The adhesion energy of the hydrophobic material in liquid form on the inner surface of the casing may be greater than 0.03 J/m$^2$, in a preferred manner greater than 0.045 J/m$^2$.

The hydrophobic material may have a water solubility less than or equal to $10^{-3}$ (fr.mol), advantageously less than or equal to $10^{-4}$ (fr.mol).

Advantageously, the hydrophobic material in liquid form has a viscosity greater than or equal to $10^{-3}$ Pa.s.

The hydrophobic material in liquid form confined in the at least one casing has for example a thickness comprised between 5 µm and 5 mm. The thickness of the wall of at least one casing may be comprised between 10 µm and 500 µm.

The casing may be made of polycarbonate, polyethylene (PE), polyethylene terephthalate (PET), polyethylene naphthalate (PEN), ethyl vinyl acetate (EVA) copolymer or polyvinyl alcohol (PVA).

For example, the hydrophobic material is a mineral oil, a silicone oil, a paraffin oil, a natural oil, a fatty acid or a long alkyl chain ester, or an alkane such as an alkane of the series $C_{12}H_{26}$ to $C_{16}H_{34}$.

The subject matter of the present invention is also a device encapsulated in an encapsulation device according to the present invention, the device being for example a photovoltaic cell or an organic light emitting diode.

The subject matter of the present invention is also a method of producing an encapsulation device according to the present invention, comprising the steps of:

a) forming a casing made of flexible polymer in which is placed the hydrophobic material, b) sealing of the casing in a sealed manner.

In an example, step a) comprises the production of a casing made of flexible polymer provided with an opening and the filling of the casing with a hydrophobic material. Step a) may comprise the stacking of two sheets of flexible polymer of similar or equal sizes, such that their peripheral edges are substantially aligned, and the joining of the peripheral edges in a sealed manner except on one portion, thereby arranging a filling opening.

Prior to step b), advantageously at least the edges of the filling opening are covered with an oleophobic material.

In another example, during step a), the edges of one or more sheets of the casing are covered with an oleophobic material, one of the sheets is coated with the hydrophobic material.

In another example, prior to step a), the hydrophobic material is solidified by lowering the temperature and shaping into a block and, during step a) the casing is formed around said solid block. For example, the hydrophobic material is tetradecane.

Preferably the solid block has convex surfaces.

The connection of the sheets and/or the closing of the filling opening is obtained for example by heat sealing or by bonding.

The subject matter of the present invention is also a method of encapsulation comprising placing the device(s) to be encapsulated in an encapsulation device according to the present invention and closing in a sealed manner the encapsulation device, for example by heat sealing or bonding.

BRIEF DESCRIPTION OF DRAWINGS

The present invention will be better understood by means of the following description and the appended drawings in which.

DETAILED DESCRIPTION OF PARTICULAR EMBODIMENTS

Figure 1:
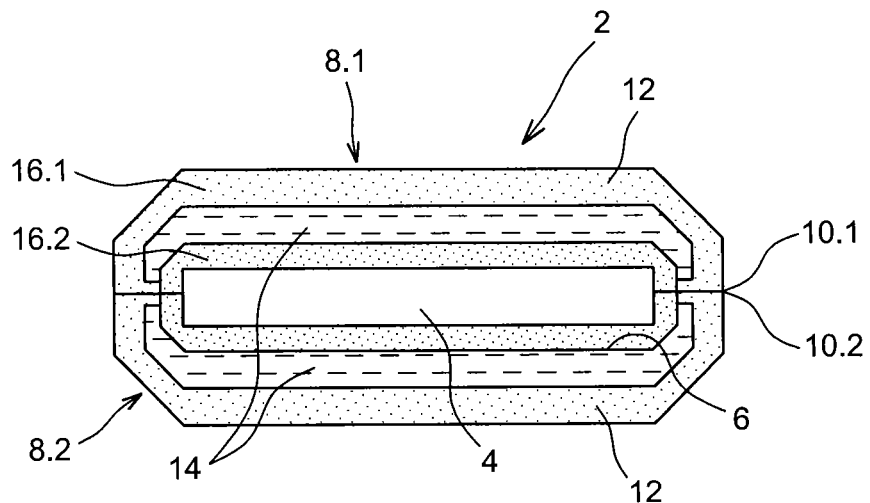
FIG. 1 is a schematic sectional view of an encapsulation device according to the present invention.

In FIG. 1 may be seen an embodiment example of an encapsulation device 2 according to the present invention inside of which is placed a device to be encapsulated 4, for example a photovoltaic cell.

The encapsulation device 2 comprises an inner sealed space 6 for receiving the device to be encapsulated 4.

In the example represented, the device to be encapsulated 4, such as a photovoltaic cell, has a low thickness compared to its surface, the example of the encapsulation device 2 represented in FIG. 1 has a shape adapted to the shape of the photovoltaic cell.

The encapsulation device 2 then comprises two walls 8.1, 8.2 placed one above the other and connected in a sealed manner over their whole exterior contour 10.1, 10.2. The two walls 8.1, 8.2 thereby connected delimit the sealed space 6 in which is placed the device to be encapsulated 4. In the representation of FIG. 1, the wall 8.1 covers the upper face of the device to be encapsulated 4 and the wall 8.2 covers the lower wall of the device to be encapsulated 4.

Figure 2:
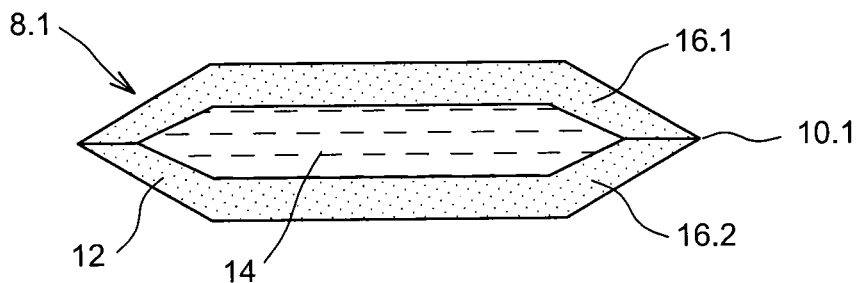
FIG. 2 is a view of an element of the device of FIG. 1, FIGS. 3A and 3B are examples of shapes of block made of hydrophobic material used in an example of a method of production according to the present invention.

Each wall 8.1, 8.2 comprises a sealed casing made of flexible polymer 12 and a hydrophobic material 14 filling the casing 12. In FIG. 2, only the wall 8.1 is represented.

Hydrophobic material is taken to mean a material having poor affinity with water.

The hydrophobic material is selected such that it is in liquid form at the operating temperature, more generally that it is liquid at ambient temperature in order to restrict the diffusion of permeable elements, i.e. which can pass through the polymer casing. Furthermore, this makes it possible to place encapsulated devices conserving their flexibility, such as organic photovoltaic cells. It thereby ensues that the choice of the hydrophobic material could depend on the temperatures of the environment in which the encapsulated devices will be intended to be used.

In the remainder of the description, the expression "hydrophobic liquid" will be used to designate the hydrophobic material, and it will be made clear when the material is in solid form.

The hydrophobic liquid fills the casing 12 such that said casing no longer contains air or gas which, if not, could pass through the sheet of polymer in contact with the device to be encapsulated and risk deteriorating it.

The casing 12 is, for example, formed of two sheets of polymers 16.1, 16.2 joined together for example by heat sealing, delimiting between them a sealed volume confining the hydrophobic liquid 14.

Figure 4:
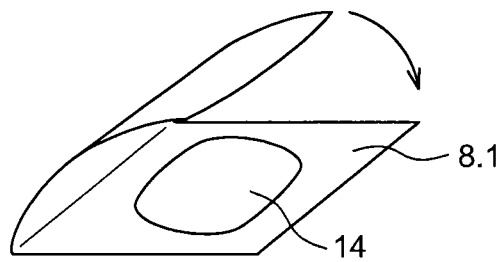
FIGS. 4 to 6 are schematic representations of embodiment variants of an encapsulation device according to the present invention.

It may also be envisaged to form the casing 12 by using only a single sheet of polymer folded back on itself, the hydrophobic liquid being situated between the two folded parts of the sheet, as is shown schematically in FIG. 4.

Figure 5:
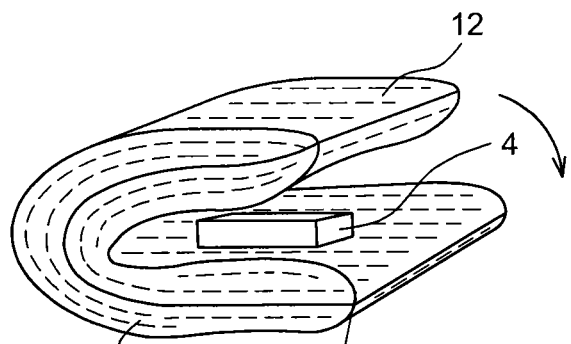

It may also be envisaged to form the encapsulation device from a wall of large size formed of a single casing filled with hydrophobic liquid, this large wall being folded back on the device to be encapsulated, as is shown schematically in FIG. 5.

It may also be envisaged to use a sheet of polymer folded into four. The first folding delimiting the space to be filled with hydrophobic liquid and the second folding delimiting the position for the device to be encapsulated.

Advantageously, the hydrophobic liquid 14 and the inner surface of the casing 12, with which the hydrophobic liquid 14 is in contact, are selected such that the hydrophobic liquid has a good wettability vis-à-vis this inner surface. This good wettability prevents the formation of bubbles of gas between the volume of hydrophobic liquid and the wall of the casing during the filling of the casing. To this end, the contact angle of a drop of hydrophobic liquid on the inner surface of the casing is less than 60°, advantageously less than 30°, and in an even more advantageous manner less than 10°.

These contact angle values may be obtained thanks to the intrinsic properties of the polymer or by the treatment of the inner surface of the casing.

Also in an advantageous manner, the hydrophobic liquid and the polymer and/or the treatment of the inner surface of the casing are chosen such that the adhesion energy is greater than $0.03$ J/m$^2$, in a preferred manner greater than $0.045$ J/m$^2$.

It will be recalled that the adhesion energy is given by the formula:

$$E_{adhesion} = \sigma \times (1 + \cos \theta)$$

$\sigma$ being the liquid-vapour interfacial energy of the hydrophobic liquid, $\theta$ being the contact angle of the liquid on the inner surface of the casing 12.

By selecting such adhesion energy values, the risks of dewetting of the hydrophobic liquid are significantly reduced, when the encapsulation device 2 is deformed, in particular when it contains a flexible device. The hydrophobic liquid then remains in contact with the whole inner surface of the casing, which reduces the risks of ingress of humidity and gas which can pass through the polymer casing 12. Consequently, the flexibility of the device may be widely exploited without risk of deteriorating the barrier formed by the oil.

The thickness of the film of hydrophobic liquid is advantageously comprised between 5 µm and 5 mm.

In addition, in order to further increase the sealing to humidity of the walls of the encapsulation device 2, advantageously a hydrophobic liquid having a minimal solubility vis-à-vis water is selected. Advantageously, the hydrophobic liquid has a solubility vis-à-vis water less than or equal to $10^{-3}$ (fr.mol), even more advantageously less than or equal to $10^{-4}$ (fr.mol), fr.mol being the molar fraction: the number of moles of water that can be solubilised in a mole of hydrophobic liquid.

Preferentially, a hydrophobic liquid is also chosen having the highest viscosity possible, which makes it possible to avoid the transport of bubbles and dissolved gas by convection through the volume of hydrophobic liquid. The viscosity is preferably greater than or equal to $10^{-3}$ Pa.s.

For example, the hydrophobic liquid implemented may be a mineral oil, a silicone oil, a paraffin oil, a natural oil, a fatty acid or a long alkyl chain acid. It may also be an alkane. By way of example, the series $C_{12}H_{26}$ to $C_{16}H_{34}$ are particularly suitable.

Long alkyl chain organic molecules such as esters and fatty acids have low polarity, and thus low solubility in water. Moreover, they also have a significant viscosity.

The hydrophobic liquid may be formed of a single type of liquid or a mixture of hydrophobic liquids such as those cited above by way of example.

In the case where the device to be encapsulated 4 is a photovoltaic cell, the assembly of the casing forming the wall that receives the incident rays (polymer and hydrophobic liquid 14 or the mixture of hydrophobic liquids) is advantageously selected such that it ensures a transmission at least equal to 80% over the whole visible domain.

The polymer may be selected from polycarbonates, polyethylene (PE), polyethylene terephthalate (PET), polyethylene naphthalate (PEN), ethyl vinyl acetate (EVA) copolymer or polyvinyl alcohol (PVA).

Moreover, the thickness of the casing is advantageously comprised between 10 µm and 500 µm, thereby offering a sufficient rigidity and tenacity.

Different examples of methods of production of an encapsulation device according to the present invention will now be described.

According to a first example of method of production, each casing 12 is formed by stacking two sheets 16.1, 16.2 made of polymer material having substantially the same dimensions, then by joining them at their outer edges, for example by heat sealing. The heat sealing thereby obtained is leak tight. Only an area of the peripheral edges is not sealed in order to enable the introduction of the hydrophobic liquid between the two sheets. This non sealed area forms a filling opening.

The hydrophobic liquid or a mixture of hydrophobic liquids is then injected between the two sheets 16.1, 16.2 through the filling opening, for example by means of a cannula.

Advantageously, the remaining air bubbles are evacuated via the filling opening. This evacuation is obtained for example by pressing.

The filling opening is then closed for example by sealing, advantageously by heat sealing or by bonding. Heat sealing has the advantage of being simple since it does not require the prior application of an adhesive.

Advantageously, it is possible to provide for a particular treatment of the parts to be sealed delimiting the filling opening, to avoid the deposition of hydrophobic liquid which could adversely affect the sealing. For example, said treatment may consist in a prior deposition of an oleophobic material on the parts to be sealed. The term "oleophobic" describes a substance having a low affinity with oils.

This treatment may consist in a deposition of such an oleophobic material directly on the sheets of polymer of the casing, or it may consist in a bonding of a small surface of another organic polymer non compatible with the hydrophobic liquid.

The oleophobic material may be for example an organosilane prepolymer comprising a perfluoroalkylated side chain curable by heat means.

Thus, during the filling of the casing with the hydrophobic liquid, said hydrophobic liquid is not deposited at the filling opening on account of the presence of the oleophobic material. The edges remaining to be sealed are thus exempt of the hydrophobic liquid, which facilitates the carrying out of the sealing.

A first wall 8.1 is then obtained.

A second wall 8.2 is formed according to the same method.

The device to be encapsulated is then placed between the two walls, the edges of which will have been made to coincide, then the edges are joined in a sealed manner, for example by heat sealing.

For example, the assembly is carried out under dry and neutral atmosphere, eliminating the presence of humidity and air during the encapsulation.

The final heat sealing may be carried out on the first heat sealings, which makes it possible not to lose surface, or it is offset with respect to the first heat sealings.

For example, the sealing is carried out between two surfaces.

According to a second example of method of production, a prior oleophobic treatment is carried out at the areas of the sheets to be sealed, i.e. on the edges of the sheets. This treatment is, for example, carried out by direct deposition of the material on the polymer sheets.

A deposition by spread coating of the hydrophobic liquid is then carried out on one of the sheets, the hydrophobic liquid positions itself naturally at the places exempt of the oleophobic treatment, the areas to be sealed are not then contaminated with the hydrophobic liquid. The heat sealing is then carried out.

The second wall is then formed in the same way and the two walls are joined around the device to be encapsulated.

According to a third embodiment example, a block obtained from the hydrophobic liquid degassed beforehand and taken to a temperature below its melting temperature is used.

The block thereby obtained is then deposited on a first polymer sheet. A second sheet is then laid flat on the non covered part of the block so as not to incorporate gas. The sheets are then joined in a sealed manner, for example by heat sealing. A first wall is then ready.

Advantageously, the block has a shape enabling an easy encasing without generating cavities that risk trapping air. For example, the blocks have convex faces.

Figure 3A:
Figure 3B:
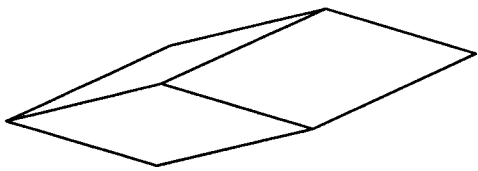

In FIGS. 3A and 3B may be seen embodiment examples of such blocks. In FIG. 3A, the block has the shape of a cylinder of elliptical section, and in FIG. 3B, the block has the shape of a prism.

A second wall is then formed in a similar manner. The device to be encapsulated is then placed between the two walls thereby formed, the sealed areas of which will have been made to coincide. The edges are then joined in a sealed manner, for example by heat sealing.

By way of example, tetradecane is used as hydrophobic material, the melting temperature of which is 5.5° C. This is shaped as a block at 0° C. and is encased between two sheets of polyethylene terephthalate (PET). Then, during its use at ambient temperature, the tetradecane melts and becomes liquid. The encapsulation device then becomes flexible.

In the case where the encapsulated device requires electrical connections, the sealed outlet of the electrical connections to the exterior of the encapsulation device is achieved in a known manner by those skilled in the art.

It is obviously understood that it may be provided to combine the steps of the methods described above.

Thanks to the present invention, benefit is taken of the advantages of the liquid phase as diffusion barrier to the gas and the advantages of the hydrophobic property as specific barrier to humidity, without the risk of degrading the encapsulated device(s), for example solubilising the polymer of a photovoltaic cell due to a direct contact with the hydrophobic liquid.

Furthermore, the encapsulation device is easy to handle, the hydrophobic liquid being confined in the pockets of polymer.

Furthermore, the size of the encapsulation device is very adaptable to any size of any device to be encapsulated.

Thanks to the invention, it is also possible to implement various treatments as a function of the targeted application, for example the deposition of a colour, an anti-reflection protection, an anti-scratch protection, etc.) on the outer or inner surfaces of the encapsulation device.

Furthermore, thanks to the invention, it is possible to assemble very easily several devices encapsulated via encapsulated devices, for example by heat sealing or by bonding, and thereby form "flexible sheets" of encapsulated devices, which may be particularly interesting in the case of photovoltaic cells.

Figure 6:
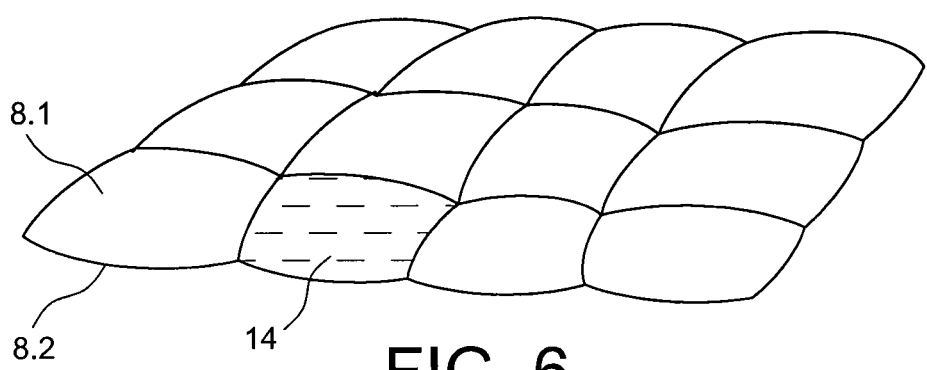

It may be envisaged to form several encapsulations simultaneously, by forming a plurality of casings filled with oil from two sheets of polymers sealed or bonded in a grid pattern, as is shown schematically in FIG. 6. By stacking two casings of this type, it is possible to obtain directly encapsulated cells in the form of a sheet.

Moreover, the encapsulation device according to the present invention is applicable to any type of device to be encapsulated that requires a protection vis-à-vis the atmosphere, and in particular humidity. For example, the encapsulation device according to the present invention may be used to encapsulate organic photovoltaic cells, organic light emitting diodes (OLED), any electronic device, microbatteries, sensors, MEMS, NEMS.

The encapsulation device according to the present invention may also be used in the opposite sense, in other words to prevent the gas contained in the encapsulation device escaping, for example a packaging for aerated beverage may be formed with the encapsulation device according to the present invention.

The invention claimed is:

1. An assembly formed of an object received in an encapsulation device, the encapsulation device comprising:
   at least one casing made of a flexible polymer material filled with at least one liquid hydrophobic material,
   the casing delimiting a sealed space receiving the object, the device being isolated from the hydrophobic material.

2. An assembly according to claim 1, wherein the at least one casing comprises a first polymer sheet and a second polymer sheet interconnected at exterior edges thereof so as to define a sealed volume to the hydrophobic material between the first and second sheets.

3. An assembly according to claim 1, comprising two casings made of a flexible polymer material each delimiting a sealed space for at least one liquid hydrophobic material, and at least one liquid hydrophobic material filling each of the casings, the casings being stacked and sealingly interconnected at peripheral edges thereof, a sealed space then being defined between the two casings.

4. An assembly according to claim 1, wherein a contact angle of a drop of liquid of the hydrophobic material on an inner surface of the at least one casing is less than 60°.

5. An assembly according to claim 4, wherein a contact angle of a drop of liquid of the hydrophobic material on an inner surface of the casing is less than 30°, or is less than 10°.

6. An assembly according to claim 4, wherein adhesion energy of the hydrophobic material in liquid form on an inner surface of the casing is greater than 0.03 J/m$^2$, or is greater than 0.045 J/m$^2$.

7. An assembly according to claim 1, wherein the hydrophobic material has a water solubility less than or equal to $10^{-3}$ (fr·mol), or less than or equal to $10^{-4}$ (fr·mol).

8. An assembly according to claim 1, wherein the hydrophobic material in liquid form has a viscosity greater than or equal to $10^{-3}$ Pa.s.

9. An assembly according to claim 1, wherein the hydrophobic material in liquid form confined in the at least one casing has a thickness between 5 μm and 5 mm.

10. An assembly according to claim 1, wherein thickness of a wall of at least one casing is between 10 μm and 500 μm.

11. An assembly according to claim 1, wherein the casing is made of polycarbonate, polyethylene (PE), polyethylene terephthalate (PET), polyethylene naphthalate (PEN), ethyl vinyl acetate (EVA) copolymer, or polyvinyl alcohol (PVA).

12. An assembly according to claim 1, wherein the hydrophobic material is a mineral oil, a silicone oil, a paraffin oil, a natural oil, a fatty acid or long alkyl chain ester, or an alkane, or an alkane of series $C_{12}H_{26}$ to $C_{16}H_{34}$.

13. An assembly according to claim 1, the object being a photovoltaic cell or an organic light emitting diode.

14. A method of producing an assembly formed of an object received in an encapsulation device, the encapsulation device including at least one casing made of a flexible polymer material filled with at least one liquid hydrophobic material, the casing delimiting a sealed space receiving the object, the device being isolated from the hydrophobic material, the method comprising:
   placing the object in a casing of the encapsulation device; and closing in a sealed manner the encapsulation device, or by heat sealing or bonding.

15. A method of production according to claim 14, comprising:
   a) forming a casing made of flexible polymer wherein is placed the hydrophobic material;
   b) sealing the casing in a sealed manner.

16. A method of production according to claim 15, wherein the forming a) comprises producing a casing made of flexible polymer provided with an opening and filling the casing with a hydrophobic material.

17. A method of production according to claim 16, wherein the forming a) comprises stacking of two sheets of flexible polymer of similar or equal sizes, such that their peripheral edges are substantially aligned, and joining the peripheral edges in a sealed manner except on one portion, thereby arranging a filling opening.

18. A method of production according to claim 16, wherein, prior to the sealing b), at least edges of the opening are covered with an oleophobic material.

19. A method of production according to claim 15, wherein, during the forming a), edges of one or more sheets of the casing are covered with an oleophobic material, one of the sheets is coated with the hydrophobic material.

20. A method of production according to claim 15, wherein, prior to the forming a), the hydrophobic material is solidified by lowering a temperature and shaping into a block and, during the forming a) the casing is formed around the block.

21. A method of production according to claim 20, wherein the hydrophobic material is tetradecane.

22. A method of production according to claim 20, wherein the block of hydrophobic material has convex surfaces.

23. A method of production according to claim 19, wherein a connection of the sheets and/or closing of a filling opening is obtained by heat sealing or by bonding.

24. A method of production according to claim 20, wherein prior to the sealing b), at least edges of a filling opening are covered with an oleophobic material.

* * * * *